United States Patent
Brodsky et al.

(10) Patent No.: US 7,799,503 B2
(45) Date of Patent: Sep. 21, 2010

(54) COMPOSITE STRUCTURES TO PREVENT PATTERN COLLAPSE

(75) Inventors: Colin J. Brodsky, Salt Point, NY (US);
Allen H. Gabor, Katonah, NY (US);
Javier Perez, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 645 days.

(21) Appl. No.: 11/750,026

(22) Filed: May 17, 2007

(65) Prior Publication Data

US 2008/0286683 A1    Nov. 20, 2008

(51) Int. Cl.
*G03F 7/00* (2006.01)
*G03F 7/004* (2006.01)

(52) U.S. Cl. .................... 430/270.1; 430/311; 430/312; 430/330; 430/331

(58) Field of Classification Search .............. 430/270.1, 430/311, 312, 330, 331
See application file for complete search history.

(56) References Cited

U.S. PATENT DOCUMENTS

| | | | |
|---|---|---|---|
| 3,873,313 A | 3/1975 | Horst, et al. | |
| 4,859,573 A | 8/1989 | Maheras et al. | |
| 5,858,620 A * | 1/1999 | Ishibashi et al. | 430/313 |
| 6,057,084 A * | 5/2000 | Mohondro | 430/330 |
| 6,361,928 B1 | 3/2002 | Yang et al. | |
| 6,465,360 B2 * | 10/2002 | Yang et al. | 438/706 |
| 6,482,720 B2 * | 11/2002 | Sugino et al. | 438/474 |
| 6,589,709 B1 * | 7/2003 | Okoroanyanwu et al. | 430/296 |
| 6,663,761 B2 * | 12/2003 | Kamijima | 205/122 |
| 6,806,036 B2 * | 10/2004 | You | 430/314 |
| 6,861,363 B2 * | 3/2005 | Harchanko et al. | 438/706 |
| 6,905,811 B2 | 6/2005 | Chen et al. | |
| 6,943,124 B1 | 9/2005 | Lu et al. | |
| 7,524,607 B2 * | 4/2009 | Ho et al. | 430/270.1 |
| 2005/0233588 A1 * | 10/2005 | Boettiger et al. | 438/689 |
| 2006/0012880 A1 * | 1/2006 | Law et al. | 359/569 |
| 2006/0160028 A1 | 7/2006 | Lee et al. | |
| 2009/0170034 A1 * | 7/2009 | Lim | 430/313 |

* cited by examiner

*Primary Examiner*—Amanda C. Walke
(74) *Attorney, Agent, or Firm*—Schmeiser, Olsen & Watts; Wenjie Li

(57) ABSTRACT

A method and a structure. The structure includes: a solid core comprising a first photoresist material, the core having a bottom surface on a substrate, a top surface and opposite first and second side surfaces between the top surface and the bottom surface; and a shell comprising a second photoresist material, the shell on the top surface of the substrate, the shell containing a cavity open to the top surface of the substrate, the shell formed over the top surface and the first and second side surfaces walls of the core, the core completely filling the cavity. The core is stiffer than the shell. The method includes: forming the core from a first photoresist layer and forming the shell from a second photoresist layer applied over the core. The core may be cross-linked to increase its stiffness.

24 Claims, 7 Drawing Sheets

US 7,799,503 B2

COMPOSITE STRUCTURES TO PREVENT PATTERN COLLAPSE

FIELD OF THE INVENTION

The present invention relates to the field of micro-photolithography; more specifically, it relates to a method for generating composite photoresist structures.

BACKGROUND OF THE INVENTION

As the dimension of the structures of integrated circuits become ever smaller the photoresist images used to define those structures during fabrication are also becoming smaller. Photoresist images have become so small that the photoresist pattern can collapse during the development step of photolithographic fabrication processes resulting in permanent defects in the integrated circuit being fabricated. Accordingly, there exists a need in the art to eliminate or reduce the phenomenon of photoresist pattern collapse.

SUMMARY OF THE INVENTION

A first aspect of the present invention is a structure, comprising: a solid core comprising a first photoresist material, the core having a bottom surface on a substrate, a top surface and opposite first and second side surfaces between the top surface and the bottom surface; and a shell comprising a second photoresist material, the shell on the top surface of the substrate, the shell containing a cavity open to the top surface of the substrate, the shell formed on and completely covering the top surface and the first and second side surfaces walls of the core, the core completely filling the cavity.

A second aspect of the present invention is a method, comprising, in the order recited: forming a first photoresist layer on a top surface of a substrate, the first photoresist layer comprising a first photoresist material; exposing the first photoresist layer through a first photomask and developing the exposed first photoresist layer to form a solid core comprising the first photoresist material, the core having a bottom surface on the substrate, a top surface and opposite first and second side surfaces between the top surface and the bottom surface; the second photoresist layer completely covering the top surface and opposite first and second side surfaces of the core, the second photoresist layer comprising a second photoresist material; and exposing the second photoresist layer through a second photomask and developing the exposed second photoresist layer to form a shell comprising the second photoresist material, the shell on the top surface of the substrate, the shell containing a cavity open to the top surface of the substrate, the shell formed over the top surface and the first and second side surfaces walls of the core, the core completely filling the cavity.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A positive photoresist is a type of photoresist in which regions of photoresist exposed to actinic radiation (e.g. ultraviolet light, electron beam or X-ray) become soluble to a photoresist developer and the regions of the photoresist that are unexposed remain insoluble in the photoresist developer. A negative photoresist is a type of photoresist in which regions of photoresist exposed to actinic radiation become insoluble in the photoresist developer and the regions of the photoresist that are unexposed are soluble in the photoresist developer. A dual-tone photoresist is a photoresist that can act as either a positive or negative photoresist depending upon processing conditions. The term positive photoresists is intended to include dual-tone photoresists processed to behave as a positive photoresist and the term negative photoresists is intended to include dual-tone photoresists processed to behave as a negative photoresist. Photoresists also include photoactive polymers such as photoactive polyimides.

After a photoresist layer is exposed through a patterned mask (or the pattern directly written into the photoresist layer without the use of a photomask) a latent image of the pattern is formed in the photoresist layer. A chemical developer is used to remove the soluble portions of the photoresist layer as described supra. The developer is then rinsed away. It is during the rinsing process, particularly when water is used as the rinsing agent that photoresist pattern collapse occurs. Pattern collapse becomes more prevalent the greater the aspect ratio (height to width) of the photoresist features formed after development. In one example, photoresist features having aspect ratios of about 3:1 or greater are prone to pattern collapse.

Figure 1:
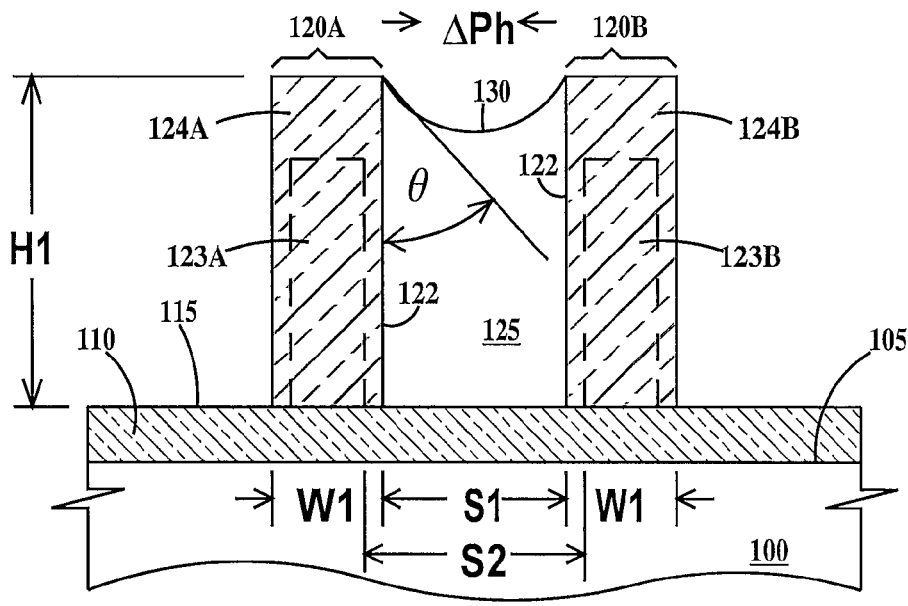
FIG. 1 is a cross-section diagram illustrating the cause of pattern collapse.

FIG. 1 is a cross-section diagram illustrating the cause of pattern collapse. In FIG. 1, a substrate 100 has a top surface 105 on which an exemplary process layer 110 has been formed. Process layer 110 may be a dielectric layer, an electrically conductive layer, or a semi-conducting layer. Formed on a top surface 115 of process layer 115 are a first photoresist feature 120A and a second photoresist feature 120B. A drop of rinse fluid 125, in this example, water, is formed between the first and second photoresist features 120A and 120B. First and second photoresist features 120A and 120B have a height H1 and a width W1 and are spaced apart a distance S1. A meniscus 130 is formed between first and second photoresist features 120A and 120B at a tangential angle θ to sidewalls 122 of the first and second photoresist features. First photoresist feature includes a virtual core 123A and a virtual shell 124A and second photoresist feature includes a virtual core 123B and a virtual shell 124B for the purposes of deriving an equation (2) that may be compared to an equation (3) derived infra. Virtual shells are spaced apart distance S1 and virtual cores are spaced apart a distance S2. A liquid between two upright structures exerts a capillary force ΔP between the two structures according to the LaPlace equation:

$$\Delta P = (2\gamma \cos\theta)/S \tag{1}$$

where ΔP has been defined supra;
S is the distance between the structures; and
γ is the surface tension of the liquid, The following equation can be derived for calculating a value of ΔPh from known or measurable parameters when photoresist features 120A and 120B are homogenous:

$$\Delta Ph = S1E1/4a((a/b)+1) \tag{2}$$

where ΔPh capillary force ΔP between photoresist features 120A and 120B;
S1 is the distance between photoresist features 120A and 120B;
E1=Young's modulus (of elasticity) of the photoresist material of first and second photoresist features 120A and 120B;
a=the cross-sectional area of virtual shell 124A or 124B (assuming they are the same); and
b=the cross-sectional area of a virtual core 123A or 123B (assuming they are the same).

Figure 2:
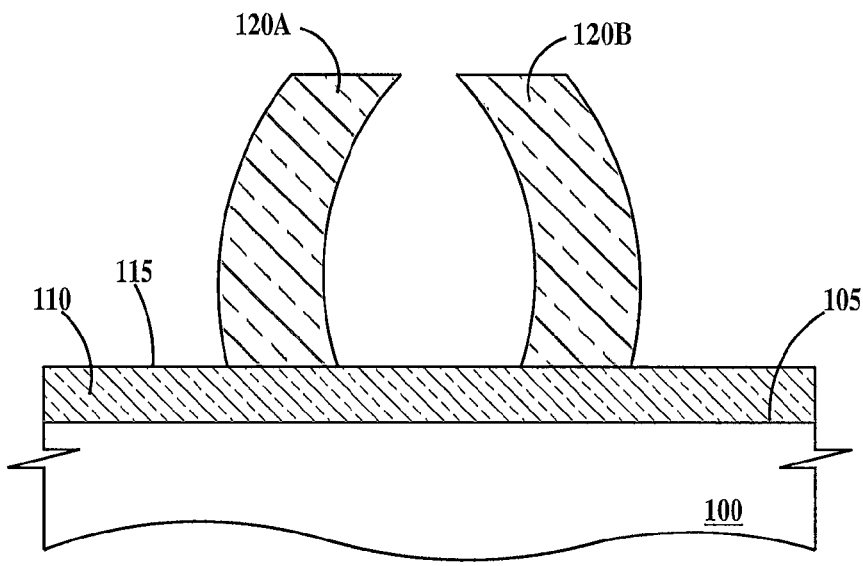
FIG. 2 is a cross-section diagram illustrating one form of pattern collapse.

FIG. 2 is a cross-section diagram illustrating one form of pattern collapse. In FIG. 2, as the rinse fluid 125 (see FIG. 1, evaporates, first and second photoresist features 120A and 120B are pulled toward each other and distorted. Note, if second photoresist feature 120B were very much wider than first photoresist feature 120A, only the first photoresist feature would distort because the aspect ratio of the second photoresist feature would be small. In extreme cases, the photoresist features can become detached from surface 115.

Figure 3A:
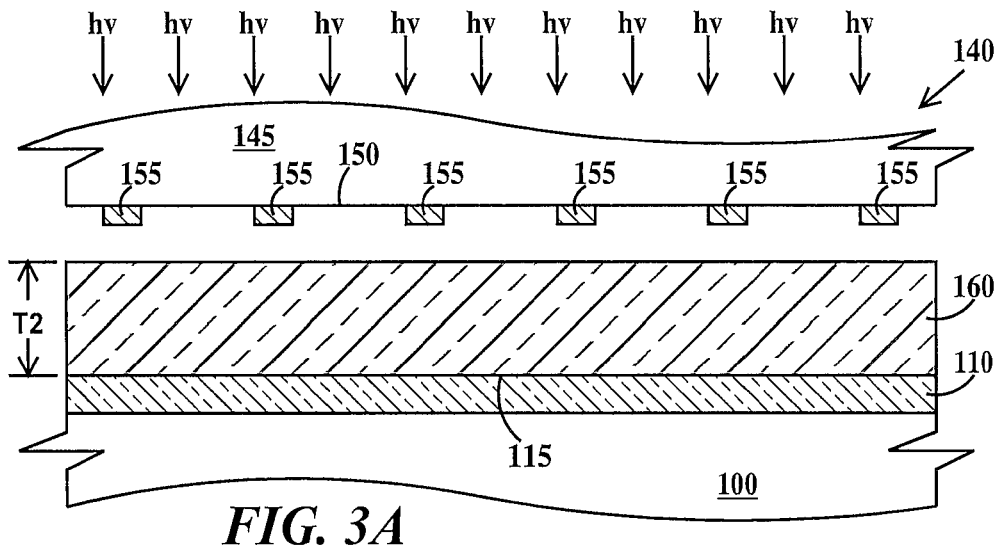
FIGS. 3A through 3E are cross-section diagrams illustrating fabrication of a first composite photoresist structure according to the present invention.

FIGS. 3A through 3E are cross-section diagrams illustrating fabrication of a first composite photoresist structure according to the present invention. In FIG. 3A, an exemplary photomask 140 includes a substrate 145 having a front surface 150 and opaque islands 155 formed on the front surface. A positive photoresist layer 160 having a thickness T2 is formed on top surface 115 of process layer 110. Photomask 140 is exposed to actinic radiation (hυ), which passes through substrate 145, is blocked by opaque islands 155 and impinges on photoresist layer 160.

Figure 3B:
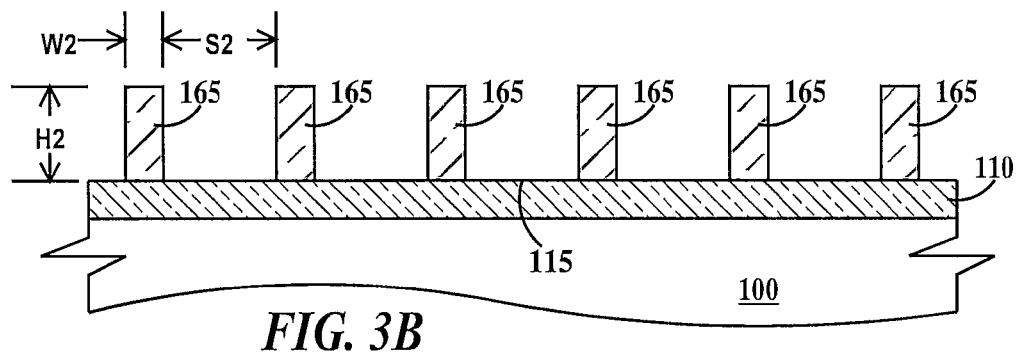

In FIG. 3B, after developing and rinsing, photoresist features 165 are formed on top surface 115 of process layer 110. Each photoresist feature 165 has a height H2 and a width W2 and are spaced apart a distance S2. Referring back to FIG. 1, H2 is less than H1, W2 is less than W1 and S2 is greater than S1.

Figure 3C:
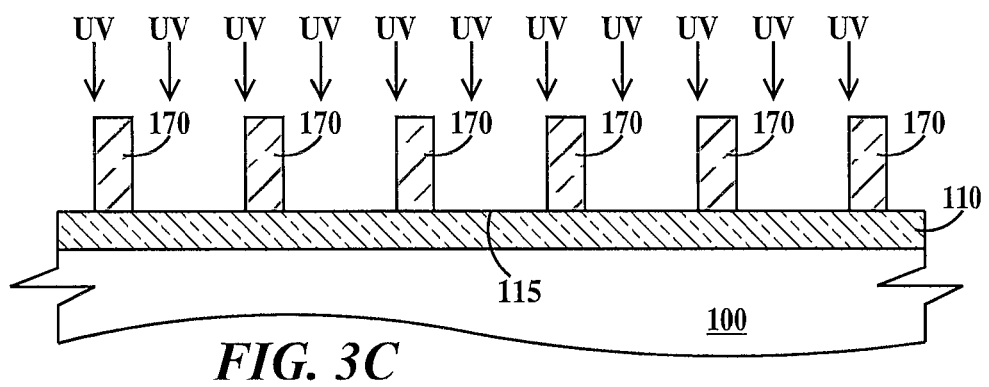

In FIG. 3C, photoresist images 165 (see FIG. 13B) are hardened (e.g. cross-linked) by exposure to ultra-violet (UV) light to form photoresist cores 170. The cross-linking increases the Young's modulus of cores 170 relative photoresist images 165.

Alternatively, hardening may be accomplished by heating or electron or ion bombardment of photoresist images 165. The hardening/cross-linking process is optional, as described infra.

Figure 3D:
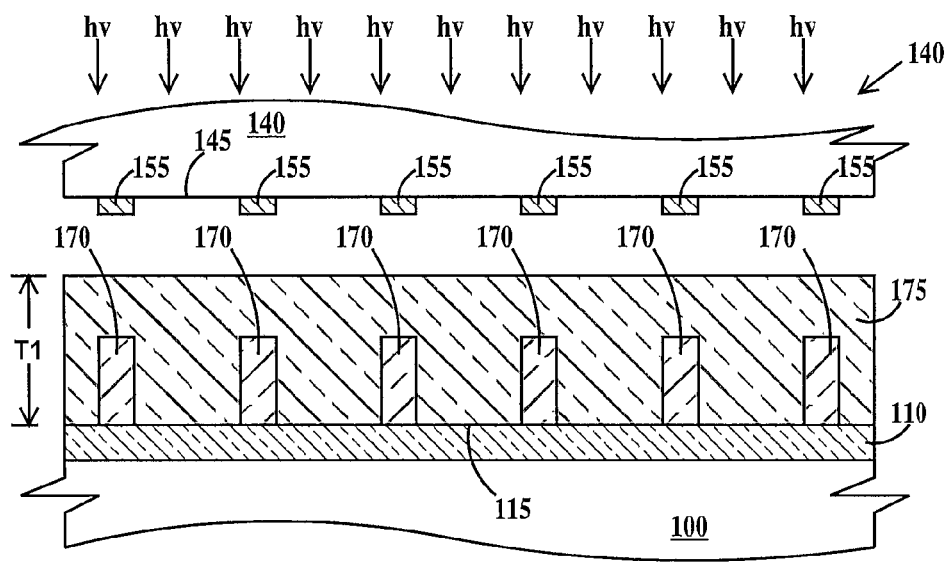

In FIG. 3D, a positive photoresist layer 175 having a thickness T1 (where T1 is greater than T2, see FIG. 3A) is formed on top surface 115 of process layer 110 and covering cores 170. Again, photomask 140 is exposed to actinic radiation (hυ), which passes through substrate 145, is blocked by opaque islands 155 and impinges on photoresist layer 175. However, the exposure dose of the actinic radiation is adjusted so as to produce a wider (W1>W2) photoresist image, (see FIG. 3E) than was produced by the exposure of FIG. 3A.

Figure 3E:
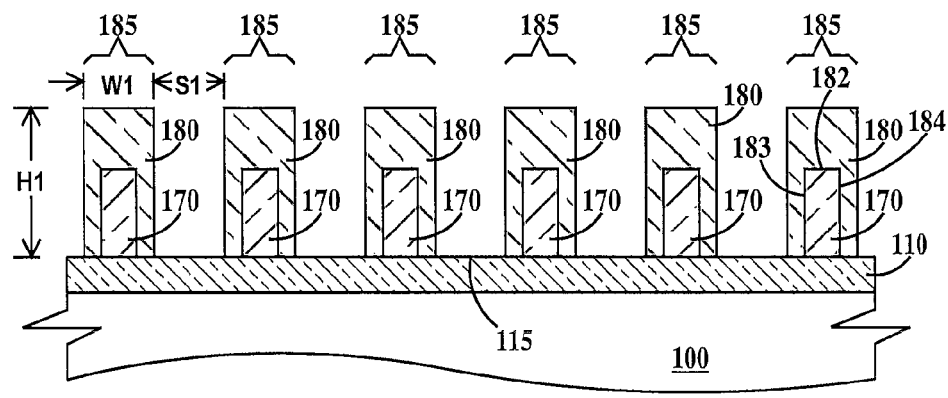

In FIG. 3E, after developing and rinsing, photoresist shells 180 are formed on top surface 115 of process layer 110, on a top surfaces 182 and sidewalls 183 and 184 of cores 170 to form composite photoresist features 185. Each composite photoresist feature 185 has a height H1 and width W1 and are spaced apart distance S1 the same as in FIG. 1 and the Young's modulus of cores 170 is greater than Young's modulus of shells 180.

Figure 3F:
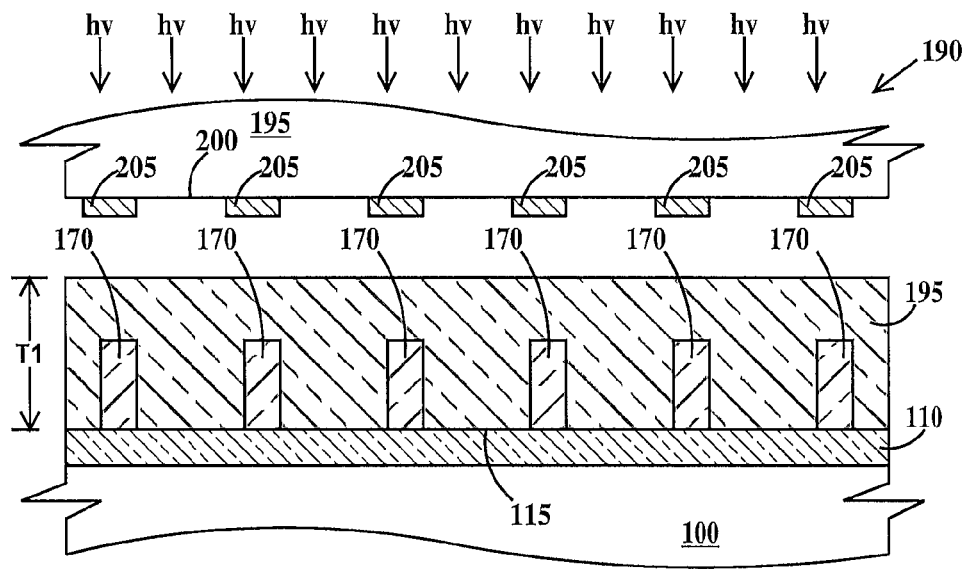
FIGS. 3F and 3G are cross-section diagrams illustrating an alternate fabrication of the first composite photoresist structure according to the present invention
Figure 3G:
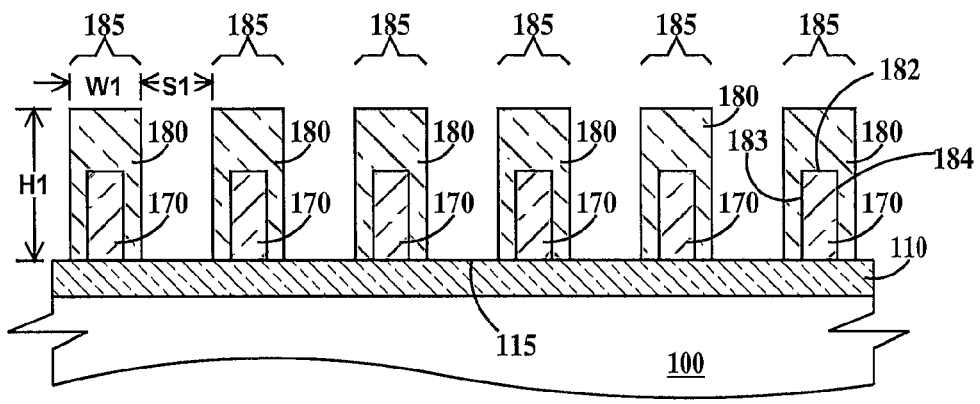

FIGS. 3F and 3G are cross-section diagrams illustrating an alternate fabrication of the first composite photoresist structure according to the present invention. FIG. 3F us similar to FIG. 3D except a second exemplary photomask 190 is used to expose photoresist layer 175. Photomask 190 includes a substrate 195 having a front surface 200 and opaque islands 200 formed on the front surface. Photomask 190 is exposed to actinic radiation (hυ), which passes through substrate 195, is blocked by opaque islands 200 and impinges on photoresist layer 175. Opaque islands 200 are wider than opaque islands 155 of photomask 140 (see FIG. 3D). FIG. 3G is the same as FIG. 3E.

Figure 4:
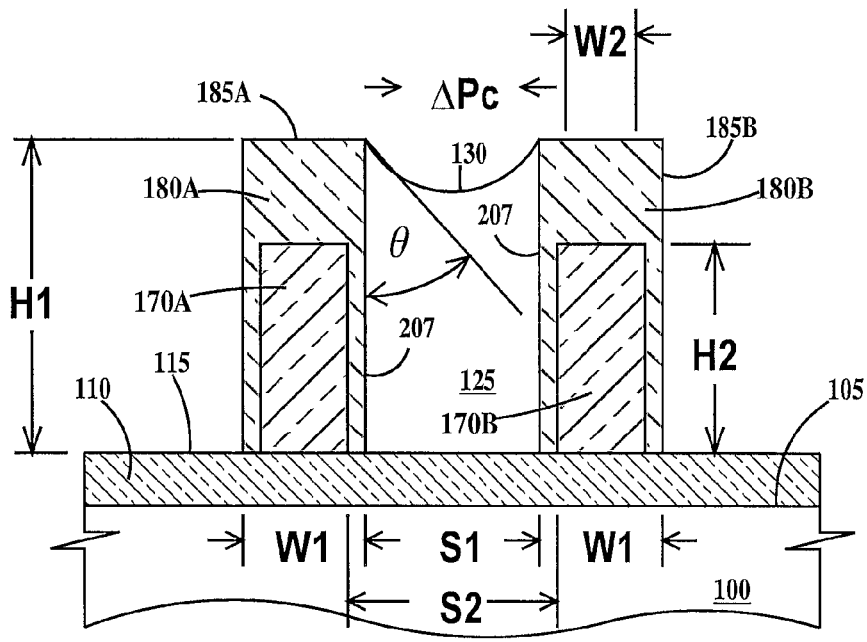
FIG. 4 is a cross-section diagram illustrating the resistance of composite structures according to the present invention to pattern collapse.

FIG. 4 is a cross-section diagram illustrating the resistance of composite structures according to the present invention to pattern collapse. In FIG. 4, substrate 100 has top surface 105 on which exemplary process layer 110 has been formed. Formed on top surface 115 of process layer 115 are a first composite photoresist feature 185A including a core 170A and a shell 180A and a second composite photoresist feature 185B including a core 170B and a shell 180B. First and second composite photoresist features were formed as illustrated in FIGS. 3A through 3G and describe supra. A drop of rinse fluid 125, in this example, water, is formed between the first and second composite photoresist features 120A and 120B. First and second composite photoresist features 185A and 185B have the same height H1 and width W1 and are spaced apart the same distance S1 as first and second photoresist images 120A and 120B of FIG. 1. Meniscus 130 is formed between first and second photoresist features 185A and 185B at tangential angle θ to sidewalls 207 of the first and second photoresist features. Rinse fluid 125 exerts a capillary force ΔPc between first and second photoresist features 185A and 185B. Photoresist shells 180 have a Young's modulus of E1 (the same photoresist features 120A and 120B of FIG. 1). Photoresist cores 170 have a Young's modulus of E2, with E2 greater than E1 (photoresist cores 170 are stiffer than photoresist shells 180 or first and second photoresist features 120A and 120B of FIG. 1). Again, starting with equation (1) for ΔP described supra, the following equation can be derived for calculating a value of ΔPc when photoresist features are composite comprising a core and shell of material each having a different Young's Modulus:

$$\Delta Pc = S1E1/4a((a/b)+y) \tag{3}$$

where ΔPh capillary force ΔP between photoresist features 185A and 185B;
S1 is the distance between shells 180A and 180B;
E1=Young's modulus of the photoresist material shells 180A and 180B (assuming E2=Young's modulus of the photoresist material of cores 170A and 170B and E2>E1);

a=the cross-sectional area of shell 180A or 180B (assuming they are the same); and b=the cross-sectional area of core 170A or 170B (assuming they are the same).

Comparing equation (2) with equation (3) (assuming E1, S1, a and b are the same in both equations) is can be seen that since y+a/b must be greater than 1+a/b when E2>E1, then ΔPc is less than ΔPh with resistance to distortion governed by the value of y. Note, the hardening process illustrated in FIG. 3C and described supra, may be eliminated if the Young's modulus E2 of cores 170A and 170B have a high enough value without cross-linking so composite photoresist features 185A and 185B are stiff enough to overcome the force ΔPc.

In one example, H1 is equal to between about 3 times H2 to about 3/2 times H2. In one example, W2 is equal to between about 1/2 times W1 to about 3/4 times W1. In one example. H1/W1 is about 3 or greater. In one example H2/W2 is about 2 or less. The relationship between H1 and H2 and W1 and W2 must be selected so that the stiffness force of first and second composite photoresist features 185A and 185B is greater than ΔPc.

Figure 5:
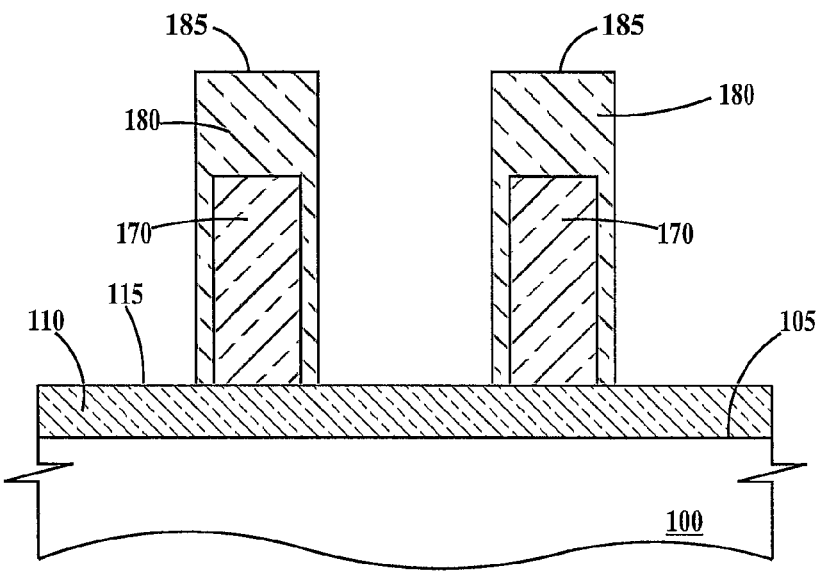
FIG. 5 is a cross-section diagram illustrating no pattern collapse of a composite structure photoresist structure according to the present invention.

Continuing from FIG. 3G, FIG. 5 is a cross-section diagram illustrating no pattern collapse of a composite structure photoresist structure according to the present invention. In FIG. 5, as the rinse fluid 125 (see FIG. 9, evaporates, first and second composite photoresist features 185A and 185B are not pulled toward each other and not distorted.

Figure 6:
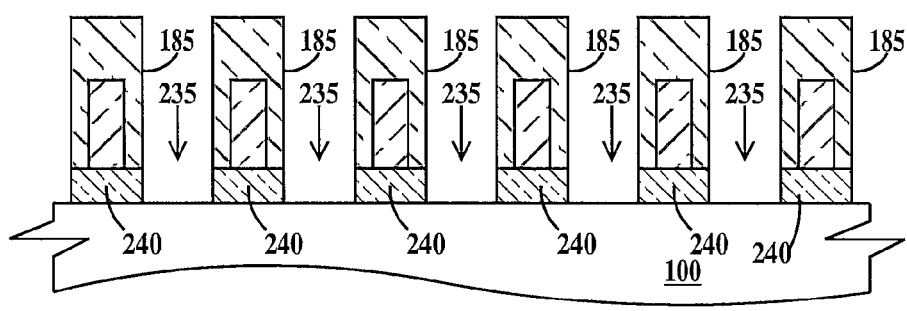
FIG. 6 is cross-section of a first exemplary process that may be performed using a composite photoresist structure according to the present invention.

FIG. 6 is cross-section of a first exemplary process that may be performed using a composite photoresist structure according to the present invention. In FIG. 6, the structures illustrated in FIG. 3E (or 3G) and described supra are subjected to a wet or dry etch (e.g. a reactive ion etch (RIE)) forming trenches 235 exposing substrate 100 (or another process layer between the substrate and the process layer) between islands 240 of process layer 110 of FIG. 3E. Composite photoresist features 185 may be subsequently removed.

Figure 7:
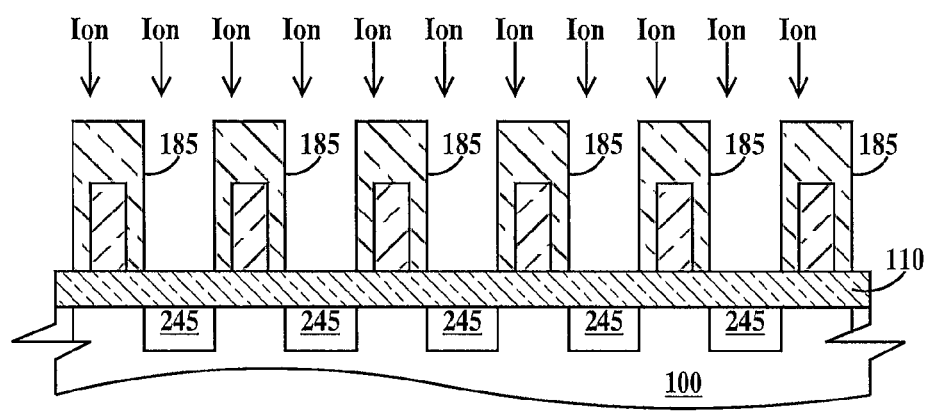
FIG. 7 is cross-section of a second exemplary process that may be performed using a composite photoresist structure according to the present invention.

FIG. 7 is cross-section of a second exemplary process that may be performed using a composite photoresist structure according to the present invention. In FIG. 7, the structures illustrated in FIG. 3E (or 3G) and described supra are subjected to ion implantation process to form ion-implanted region 245 (e.g. doped regions if the ions contain arsenic, phosphorus or boron) into substrate 100. Composite photoresist features 185 may be subsequently removed.

Figure 8:
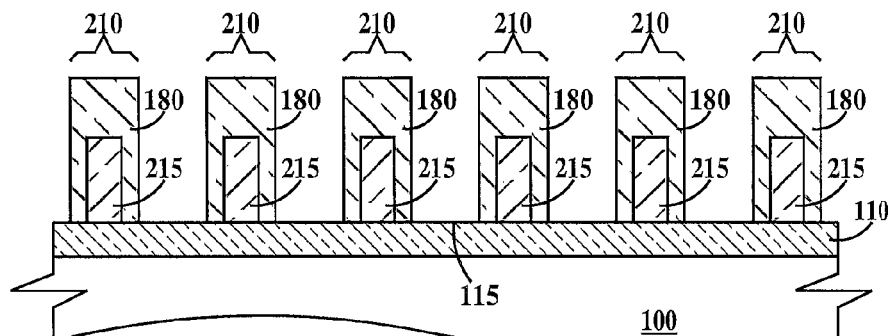
FIG. 8 is a cross-section of a second composite photoresist according to the present invention.

FIG. 8 is a cross-section of a second composite photoresist according to the present invention. In FIG. 8, composite photoresist features 210 include a negative photoresist core 215 and positive photoresist shell 180. Since positive and negative tone photoresists are used, a different photomask is used to form core 215 than that used to form shell 180.

Figure 9:
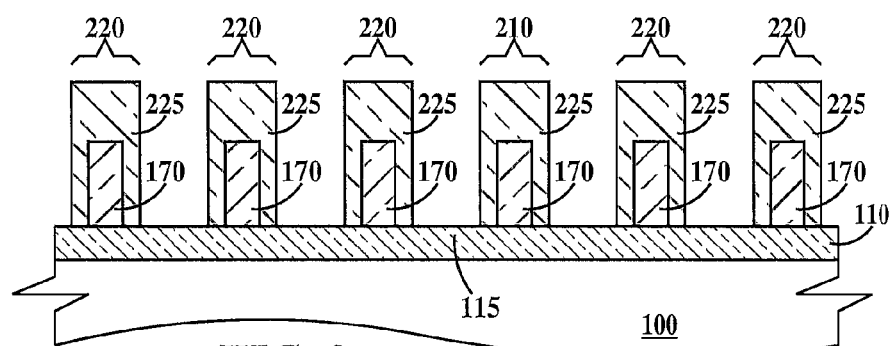
FIG. 9 is a cross-section of a third composite photoresist according to the present invention.

FIG. 9 is a cross-section of a third composite photoresist according to the present invention. In FIG. 9, composite photoresist features 220 include positive photoresist core 170 and negative photoresist shell 225. Since positive and negative tone photoresists are used, a different photomask is used to form core 170 than that used to form shell 225.

Figure 10:
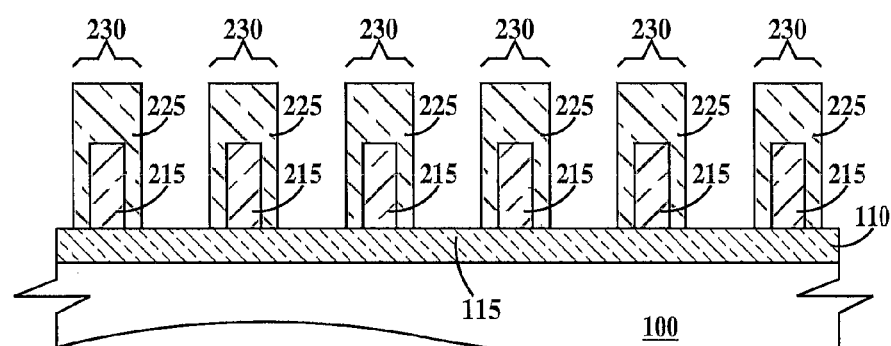
FIG. 10 is a cross-section of a fourth composite photoresist according to the present invention.

FIG. 10 is a cross-section of a fourth composite photoresist according to the present invention. In FIG. 10, composite photoresist features 230 include negative photoresist core 215 and negative photoresist shell 225. Since only negative tone photoresists is used, a same photomask may be used to form core 215 and shell 225.

Thus, the present invention provides a method to eliminate or reduce the photoresist pattern collapse.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
    a solid core comprising a first photoresist material, said core having a bottom surface on a substrate, a top surface and opposite first and second side surfaces between said top surface and said bottom surface;
    a shell comprising a single layer of a second photoresist material, said shell on said top surface of said substrate, said shell containing a cavity open to said top surface of said substrate, said shell covering an entirety of said top surface and entireties of said first and second side surfaces walls of said core, said core completely filling said cavity; and
    wherein a first Young's modulus of said core is greater than a second Young's modulus of said shell.

2. The structure of claim 1, wherein said first photoresist material is more highly cross-linked than said second photoresist material.

3. The structure of claim 1, wherein (i) said first and second photoresist materials are both positive photoresist materials or (ii) said first and second photoresist materials are both negative photoresist materials.

4. The structure of claim 1, wherein (i) said first photoresist material is a positive photoresist material and second photoresist material is a negative photoresist material or (ii) said first photoresist material is a negative photoresist material and second photoresist material is a positive photoresist material.

5. The structure of claim 1, wherein a height (H1) of said shell measured from said top surface of said substrate to a top surface of said shell is at least three times a width (W1) of said shell measured in a direction perpendicular to opposite facing sidewalls of said shell.

6. The structure of claim 1, wherein a height of said core (H2) measured from said top surface of said substrate to said top surface of said core is less than three times a width (W2) of said core measured in a direction perpendicular to first and second sidewalls of said core.

7. The structure of claim 6, wherein H1 is equal to between about 3 times H2 to about 3/2 times H2 and W2 is equal to between about 1/2 times W1 to about 3/4 times W1.

8. A method, comprising, in the order recited:
    forming a first photoresist layer on a top surface of a substrate, said first photoresist layer comprising a first photoresist material;
    exposing said first photoresist layer to a first ultraviolet radiation through a first photomask and developing said exposed first photoresist layer to form a solid core comprising said first photoresist material, said core having a bottom surface on said substrate, a top surface and opposite first and second side surfaces between said top surface and said bottom surface;
    forming a second photoresist layer on said top surface of a substrate and over said core, said second photoresist layer completely covering said top surface and opposite first and second side surfaces of said core, said second photoresist layer comprising a second photoresist material;
    exposing said second photoresist layer to a second ultraviolet radiation through a second photomask and developing said exposed second photoresist layer to form a shell comprising a single layer of said second photoresist material, said shell on an entirety of said top surface of said substrate and entireties of said first and second side surfaces, said shell containing a cavity open to said top surface of said substrate, said core completely filling said cavity; and wherein a first Young's modulus of said core is greater than a second Young's modulus of said shell.

9. The method of claim 8, further including:
between exposing said first photoresist layer through a first photomask and developing said exposed first photoresist layer and said forming a second photoresist layer, cross-linking said first photoresist material.

10. The method of claim 8, further including:
between said developing said exposed first photoresist layer and said forming said second photoresist layer, exposing said core to a blanket third ultra-violet radiation to harden said core.

11. The method of claim 8, wherein (i) said first and second photoresist materials are both positive photoresist materials or (ii) said first and second photoresist materials are both negative photoresist materials.

12. The method of claim 8, wherein (i) said first photoresist material is a positive photoresist material and second photoresist material is a negative photoresist material or (ii) said first photoresist material is a negative photoresist material and second photoresist material is a positive photoresist material.

13. The method of claim 8, wherein a height (H1) of said shell measured from said top surface of said substrate to a top surface of said shell is at least three times a width (W1) of said shell measured in a direction perpendicular to opposite facing sidewalls of said shell.

14. The method of claim 13, wherein a height of said core (H2) measured from said top surface of said substrate to said top surface of said core is less than three times a width (W2) of said core measured in a direction perpendicular to first and second sidewalls of said core.

15. The method of claim 14, wherein H1 is equal to between about 3 times H2 to about 3/2 times H2 and W2 is equal to between about 1/2 times W1 to about 3/4 times W1.

16. The method of claim 8, wherein said first and second photomasks are a same photomask.

17. The method of claim 8, further including:
said substrate including an etchable layer, a top surface of said etchable layer being said top surface of said substrate; and
after said exposing said second photoresist layer through a second photomask and developing said exposed second photoresist layer, etching a trench in said etchable layer where said etchable layer is not protected by said core and said shell.

18. The method of claim 8, further including:
after said exposing said second photoresist layer through a second photomask and developing said exposed second photoresist layer, ion implanting a dopant species into substrate where said substrate is not protected by said core and said shell.

19. The method of claim 8, further including:
between said developing said exposed first photoresist layer and said forming said second photoresist layer, heating said core to harden said core.

20. The method of claim 8, further including:
between said developing said exposed first photoresist layer and said forming said second photoresist layer, exposing said core to electron bombardment to harden said core.

21. The method of claim 8, further including:
between said exposed first photoresist layer and said forming said second photoresist layer, exposing said core to ion bombardment to harden said core.

22. The method of claim 8, further including:
said developing of said second photoresist layer creating a space between said shell and any adjacent photoresist structures.

23. The structure of claim 1, further including:
a space between said shell and adjacent photoresist structures.

24. A structure, comprising:
first and second solid cores, each core comprising a first photoresist material, each core having a respective bottom surface on a substrate, a respective top surface and respective opposite first and second side surfaces between said top surface and said bottom surface;
a first shell comprising a single layer of a second photoresist material, said first shell on said top surface of said substrate, said first shell containing a first cavity open to said top surface of said substrate, said first shell covering an entirety of said top surface and entireties of said first and second side surfaces walls of said first core, said first core completely filling said first cavity;
a second shell comprising a single layer of said second photoresist material, said second shell on said top surface of said substrate, said second shell containing a second cavity open to said top surface of said substrate, said second shell covering an entirety of said top surface and entireties of said second and second side surfaces walls of said second core, said second core completely filling said second cavity;
a first feature comprised of said first core and said first shell and a second feature comprised of said second core and said second shell, said first and second features spaced apart; and
wherein a Young's modulus of said first and second cores has a high enough value to overcome a capillary force pulling said first and second features together when a liquid fills the space between said first and second features.

* * * * *